United States Patent
Yeh et al.

(10) Patent No.: US 10,795,770 B2
(45) Date of Patent: Oct. 6, 2020

(54) REARRANGING DATA IN MEMORY SYSTEMS

(71) Applicants: Macronix International Co., Ltd., Hsinchu (TW); MegaChips Corporation, Osaka-shi (JP)

(72) Inventors: Yuchih Yeh, Hsin-Chu (TW); Naping Kuo, Hsin-chu (TW); Yuko Tamagawa, Osaka (JP)

(73) Assignees: Macronix International Co., Ltd., Hsinchu (TW); MegaChips Corporation, Osaka (JP)

( * ) Notice: Subject to any disclaimer, the term of this patent is extended or adjusted under 35 U.S.C. 154(b) by 208 days.

(21) Appl. No.: 16/031,012

(22) Filed: Jul. 10, 2018

(65) Prior Publication Data

US 2019/0324855 A1  Oct. 24, 2019

(30) Foreign Application Priority Data

Apr. 23, 2018 (JP) ................. 2018-082594

(51) Int. Cl.
   *G06F 11/00* (2006.01)
   *G06F 11/14* (2006.01)
   *G06F 12/10* (2016.01)
   *G06F 11/10* (2006.01)
   *G11C 29/52* (2006.01)

(52) U.S. Cl.
   CPC ........ *G06F 11/142* (2013.01); *G06F 11/1068* (2013.01); *G06F 12/10* (2013.01); *G11C 29/52* (2013.01); *G06F 2201/82* (2013.01); *G06F 2212/1032* (2013.01); *G06F 2212/7201* (2013.01)

(58) Field of Classification Search
   CPC ............... G06F 11/142; G06F 11/1068
   See application file for complete search history.

(56) References Cited

U.S. PATENT DOCUMENTS

| | | | |
|---|---|---|---|
| 5,479,638 A | 12/1995 | Assar et al. | |
| 6,856,568 B1 * | 2/2005 | Wong | G11C 11/56 365/185.25 |
| 7,660,941 B2 | 2/2010 | Lee et al. | |

(Continued)

FOREIGN PATENT DOCUMENTS

| | | |
|---|---|---|
| TW | 201201214 | 1/2012 |
| TW | 201734810 | 10/2017 |

*Primary Examiner* — Jonathan D Gibson
(74) *Attorney, Agent, or Firm* — Fish & Richardson P.C.

(57) ABSTRACT

Methods, systems and apparatus including computer-readable mediums for rearranging data for refresh operations in memory systems such as NAND flash memory devices are provided. In one aspect, a method includes: determining that a particular logical page in a logical block fails based on error bits in a particular physical page that is in a first physical block mapped with the logical block and corresponds to the particular logical page, logical pages in the logical block being mapped to physical pages in the first physical block with an initial mapping order, and executing a refresh operation on the first physical block with a rearranged mapping order for the logical block, the rearranged mapping order being different from the initial mapping order. For the refresh operation, the logical pages in the logical block are mapped to physical pages in a second physical block with the rearranged mapping order.

22 Claims, 11 Drawing Sheets

(56) References Cited

U.S. PATENT DOCUMENTS

| | | | |
|---|---|---|---|
| 7,793,036 B2* | 9/2010 | Goh | G06F 12/0246 |
| | | | 711/103 |
| 7,797,481 B2 | 9/2010 | Lee et al. | |
| 8,356,152 B2 | 1/2013 | You | |
| 8,825,942 B2* | 9/2014 | Ye | G06F 3/0613 |
| | | | 707/693 |
| 9,298,534 B2* | 3/2016 | Miyamoto | G06F 11/073 |
| 9,304,900 B2* | 4/2016 | Liu | G06F 12/0862 |
| 9,547,459 B1* | 1/2017 | BenHanokh | G06F 3/0646 |
| 9,898,200 B2 | 2/2018 | Yang et al. | |
| 10,289,559 B2* | 5/2019 | Huang | G06F 12/1009 |
| 10,324,664 B2* | 6/2019 | So | G06F 3/0616 |
| 10,373,669 B2* | 8/2019 | Nakanishi | G11C 11/005 |
| 10,552,314 B2* | 2/2020 | Takeda | G06F 3/0679 |
| 2007/0124531 A1 | 5/2007 | Nishihara | |
| 2008/0301397 A1* | 12/2008 | Goh | G06F 12/0875 |
| | | | 711/202 |
| 2010/0293348 A1* | 11/2010 | Ye | G06F 3/0613 |
| | | | 711/157 |
| 2011/0238890 A1* | 9/2011 | Sukegawa | G06F 12/0246 |
| | | | 711/103 |
| 2011/0296133 A1* | 12/2011 | Flynn | G06F 3/0619 |
| | | | 711/171 |
| 2014/0223079 A1* | 8/2014 | Zhang | G06F 12/0246 |
| | | | 711/103 |
| 2017/0277472 A1* | 9/2017 | Huang | G06F 12/1009 |
| 2017/0300423 A1* | 10/2017 | Kamruzzaman | G11C 16/3495 |
| 2018/0150389 A1* | 5/2018 | Bhargava | H04L 9/0891 |
| 2018/0188962 A1* | 7/2018 | Ji | G06F 3/0679 |
| 2019/0107957 A1* | 4/2019 | Helmick | G06F 3/064 |

\* cited by examiner

330

| No. | Criterion |
|---|---|
| 1 | A refresh count of a logical block is no less than a refresh count threshold |
| 2 | A refresh count of a memory is no less than a refresh count threshold |
| 3 | A new failed LPA is the same as a stored failed LPA |
| 4 | A new failed LPA is within a stored list of failed LPAs |

REARRANGING DATA IN MEMORY SYSTEMS

CROSS REFERENCE TO RELATED APPLICATIONS

This application claims priority to Japanese Patent Application No. JP2018-082594 entitled "Nonvolatile memory device, memory control device, and memory control method" filed on Apr. 23, 2018, the entire content of which is incorporated herein by reference.

BACKGROUND

Some memory systems, e.g., NAND flash memory, suffer from read disturbance effects caused by repeated read operations, which may impact data integrity. To prevent data corruption, a memory controller can execute refresh operations on physical blocks in a memory. In some cases, a mapping order from logical pages in a logical block to physical pages in a physical block is fixed, and data in a weak page or layer can be repeatedly copied to the same physical address in the physical block during the refresh operations, which can cause frequent refresh operations on the physical block and affect a performance of the memory.

SUMMARY

The present disclosure describes systems and techniques for rearranging data in memory systems, e.g., non-volatile memory systems such as NAND flash memory.

One aspect of the present disclosure features a method of rearranging data in a memory, including: determining that a particular logical page in a logical block fails based on error bits in a particular physical page that is in a first physical block mapped with the logical block and corresponds to the particular logical page, logical pages in the logical block being mapped to physical pages in the first physical block with an initial mapping order; and executing a refresh operation on the first physical block with a rearranged mapping order for the logical block, the rearranged mapping order being different from the initial mapping order. For the refresh operation, the logical pages in the logical block are mapped to physical pages in a second physical block with the rearranged mapping order.

Determining that the particular logical page fails can include determining a count of the error bits of the particular physical page is beyond a predetermined threshold. The predetermined threshold can be based on a number of error bits that an error correcting code (ECC) for the particular physical page is capable to correct.

In some implementations, the rearranged mapping order is offset from the initial mapping order by an offset number, and physical page addresses (PPAs) in the second physical block that the logical pages are mapped to are offset by the offset number relative to PPAs in the first physical block that the logical pages are mapped to. In some examples, the offset number is 1. The method can further include storing the offset number in a logical to physical (L2P) mapping table.

In some implementations, the method further include: determining that a criterion is met, wherein the criterion is associated with one or more refresh operations caused by failed logical pages in the memory; and in response to determining that the criterion is met, executing the refresh operation on the first physical block with the rearranged mapping order for the logical block.

In some examples, determining that the criterion is met include determining that a refresh count of the logical block is no less than a refresh count threshold, where the refresh count is configured to be increased when a refresh operation is performed on a physical block mapped with the logical block.

In some examples, determining that the criterion is met includes determining that a refresh count of the memory is no less than a refresh count threshold, where the refresh count is configured to be increased when a refresh operation is performed on a physical block in the memory. The physical block can be mapped with a second logical block different from the logical block.

In some examples, determining that the criterion is met includes determining that a logical page address (LPA) of the failed particular logical page is same as a stored LPA of a failed logical page.

In some examples, determining that the criterion is met includes: determining that a particular logical page address (LPA) of the failed particular logical page is within a stored list of LPAs of failed logical pages. The method can further include: updating the stored list of LPAs of failed logical pages by including a plurality of LPAs of most recent failed logical pages. The method can also include: updating the stored list of LPAs of failed logical pages by including LPAs of failed logical pages having a number of failed times over a threshold.

The method can further include: migrating data in the physical pages of the first physical block to the physical pages of the second physical block based on the rearranged mapping order. The method can include: updating a logical to physical (L2P) mapping table by storing an L2P mapping from the logical block to the second physical block.

Another aspect of the present disclosure features a memory system for rearranging data including: a memory including physical blocks each having a plurality of physical pages; and a memory controller coupled to the memory and configured to: determine that a particular logical page in a logical block fails based on error bits in a particular physical page that is in a first physical block mapped with the logical block and corresponds to the particular logical page, logical pages in the logical block being mapped to physical pages in the first physical block with an initial mapping order; and execute a refresh operation on the first physical block with a rearranged mapping order for the logical block, the rearranged mapping order being different from the initial mapping order, where, for the refresh operation, the logical pages in the logical block are mapped to physical pages in a second physical block with the rearranged mapping order.

In some implementations, the memory controller is configured to: determine whether a criterion is met, the criterion being associated with one or more refresh operations caused by failed logical pages in the memory. In response to determining that the criterion is met, the memory controller can be configured to execute the refresh operation on the first physical block with the rearranged mapping order for the logical block; in response to determining that the criterion is not met, the memory controller can be configured to execute a second refresh operation on the first physical block with a fixed mapping order for the logical block, the fixed mapping order being same as the initial mapping order, wherein, for the second refresh operation, the logical pages in the logical block are mapped to physical pages in a third physical block with the fixed mapping order.

In some examples, the criterion includes one of: a refresh count of the logical block being no less than a first refresh count threshold, a refresh count of the memory being no less than a second refresh count threshold, a logical page address (LPA) of the particular logical page is same as a stored LPA of a failed logical page, and the PPA of the particular logical page is within a stored list of PPAs of failed logical pages.

The memory controller can be configured to determine that the particular logical page fails by determining a count of the error bits of the particular physical page is beyond a predetermined threshold, and the predetermined threshold can be based on a number of error bits that an error correcting code (ECC) for the particular physical page is capable to correct.

The memory controller can be configured to: migrate data in the physical pages of the first physical block to the physical pages of the second physical block based on the rearranged mapping order; and update a logical to physical (L2P) mapping table by storing an L2P mapping from the logical block to the second physical block.

The rearranged mapping order can be offset from the initial mapping order by an offset number, and physical page addresses (PPAs) in the second physical block that the logical pages are mapped to can be offset by the offset number relative to PPAs in the first physical block that the logical pages are mapped to. The memory can be one of a two-dimensional (2D) memory and a three-dimensional (3D) memory.

A further aspect of the present disclosure features a memory controller for rearranging data for refresh operations in a memory. The memory controller includes: at least one processor; and at least one non-transitory machine-readable storage medium coupled to the at least one processor having machine-executable instructions stored thereon that, when executed by the at least one processor, cause the at least one processor to perform operations including: determining that a particular logical page in a logical block fails based on error bits in a particular physical page that is in a first physical block mapped with the logical block and corresponds to the particular logical page, logical pages in the logical block being mapped to physical pages in the first physical block with an initial mapping order; determining whether a criterion is met, the criterion being associated with one or more refresh operations caused by failed logical pages in the memory; in response to determining that the criterion is not met, executing a first refresh operation on the first physical block with a fixed mapping order for the logical block, the fixed mapping order being same as the initial mapping order, where, for the first refresh operation, the logical pages in the logical block are mapped to physical pages in a second physical block with the fixed mapping order; and in response to determining that the criterion is met, executing a second refresh operation on the first physical block with a rearranged mapping order for the logical block, the rearranged mapping order being different from the initial mapping order, where, for the second refresh operation, the logical pages in the logical block are mapped to physical pages in a third physical block with the rearranged mapping order.

A further aspect of the present disclosure features a method of rearranging data in a memory, including: determining that a particular logical page in a logical block fails based on error bits in a particular physical page that is in a first physical block mapped with the logical block and corresponds to the particular logical page; and executing a refresh operation on the first physical block by rearranging data in the first physical block to a second physical block with at least one programming parameter different from that for the data programmed to the first physical block.

The at least one programming parameter can include programming time, programming voltage, internal time, or a mapping order for the logical block. In some implementations, when a particular logical page in the logical block fails based on error bits of the particular physical block, the refresh operation is executed by rearranging programing time, programing voltage, internal time, a mapping order for the logical block, or any combination thereof In some implementations, logical pages in the logical block are mapped to physical pages in the first physical block with an initial mapping order, and the logical pages in the logical block are mapped to physical pages in the second physical block with a rearranged mapping order that is different from the initial mapping order.

Implementations of the above techniques include methods, systems, computer program products and computer-readable media. In one example, a method can be performed by a memory controller coupled to a non-volatile memory and the method can include the above-described actions performed by the memory controller, e.g., the actions for rearranging data for refresh operations in the memory. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

In the techniques, a refresh operation can use logical to physical (L2P) mapping with a fixed order, a rearranged order or both. A criterion for deciding which mapping order to be adopted for a refresh operation can be based on logical page address (LPA), refresh count of a memory or a logical block, or a physical address. A rearranging offset (or a physical location shift number) can be updated in L2P tables or recorded in any kinds of memory cells or definitions, e.g., using an index, for calculating real physical addresses. The rearranging offset or the physical location shift number can be counted in page address (for 2D memory), layer addresses (for 3D memory), or block address. A memory controller can manage data rearrangement for refresh operations for one block or for a different number of blocks or pages.

The techniques can be implemented for any type of controllers to reduce refresh operations on a memory that suffers from read disturbance, data retention, and/or other disturbance effects. The techniques can be applied to any type of data migration or rearrangement for moving data from an original block to a new block, such as refresh operation and error handling.

The techniques can be applied to various memory types, such as SLC (single-level cell) devices, or MLC (multi-level cell) devices like 2-level cell devices or TLC (triple-level cell) devices. The techniques can be applied to various dimensions of memory systems, such as two-dimensional (2D) memory systems or three-dimensional (3D) memory systems. The techniques can be applied to various types of non-volatile memory systems, such as NAND flash memory, among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description

DETAILED DESCRIPTION

Implementations of the present disclosure provide systems and methods for rearranging data, e.g., for refresh operations, in a memory system, e.g., to reduce read disturbance effects. Repeated read operations on the same physical address can place stress on a memory which can result in a read disturbance. Similarly, repeated read operations on one or more logical pages (e.g., hot read spots) can cause severe read disturbance on a physical address associated with a particular logical page or layer. If the particular logical page or layer is mapped to a same physical address in a physical block during multiple refresh operations, the physical block can experience high failed bit counts, which can cause even more frequent refresh operations on the physical block. However, if the particular logical page or layer is mapped to different physical addresses in different physical blocks during the multiple refresh operations, the physical blocks can extend their lifetimes to endure more refresh operations.

As discussed with details below, logical pages in a logical block can be mapped to a physical block with a fixed order or a rearranged order or both. A memory controller can be configured to determine when to perform a refresh operation for a logical block (or a physical block that the logical block is mapped to), e.g., based on a comparison of a failed bit count (or an error bit count) of a physical page or layer and a threshold of error correcting code (ECC). The memory controller can also be configured to determine which mapping order (a fixed order or a rearranged order) to use, e.g., based on a refresh count of an individual logical block, a refresh count of the memory, a comparison of an LPA of a new failed page or layer and a stored LPA of a failed page or layer, or a determination of an LPA of a new failed page or layer in a stored list of LPAs of failed pages or layers.

Figure 1A:
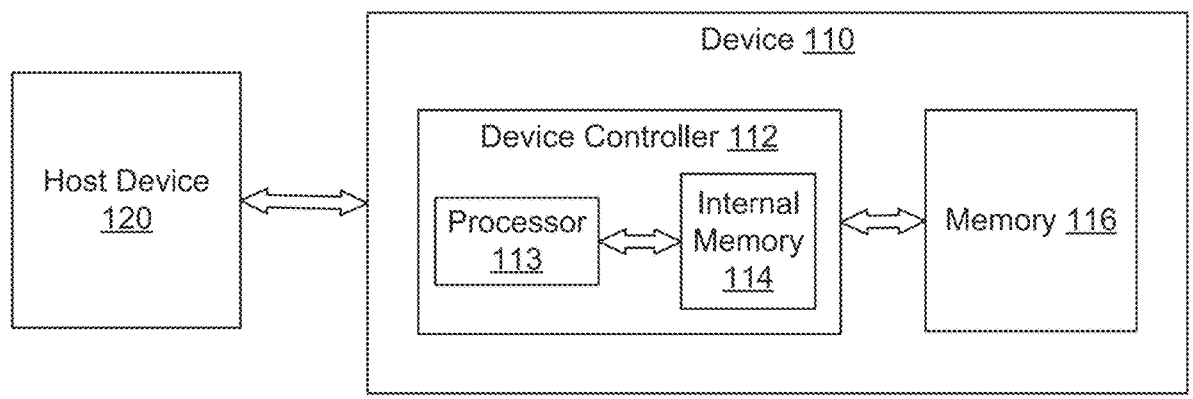
FIG. 1A illustrates an example of a system including a memory device, according to one or more implementations.

FIG. 1A illustrates an example of a system 100 for rearranging data. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

As discussed in further details below, the device controller 112 is configured to detect data integrity, e.g., read disturbance, for the memory 116. The device controller 112 can detect respective failed bit counts (or error bit counts) for individual pages or blocks in the memory 116, for example, by detecting an error by a parity check and storing a count of the number of errors. The device controller 112 can then determine whether a failed bit count (or an error bit count) of a page is over a threshold, e.g., associated with error-correcting code (ECC). If the failed bit count in a page is over the threshold, the device controller 112 determines to perform a refresh operation on a block including the page. The device controller 112 can determine which mapping order to be adopted based on whether a criterion is met. The criterion can be based on one or more refresh operations previously executed and caused by failed logical (or physical) pages in the memory 116. The criterion can include that a refresh count of a logical block is no less than (identical to or more than) a predetermined threshold, a refresh count of the memory 116 is no less than a predetermined threshold, an LPA of a new failed page or layer is the same as a stored LPA of a failed page or layer, or an LPA of a new failed page or layer is within a stored list of LPAs of failed pages or layers. When the criterion is not met, the device controller 112 maps the logical block to a new physical block by adopting a fixed mapping order; when the criterion is met, the device controller 112 maps the logical block to a new physical block by adopting a rearranged mapping order.

Figure 1B:
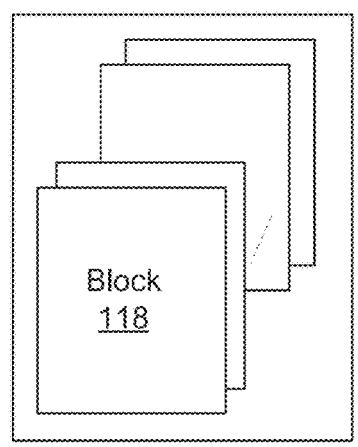
FIG. 1B illustrates an example of a memory including memory blocks, according to one or more implementations.

FIG. 1B illustrates an example configuration of the memory 116 that includes a plurality of physical blocks 118. The memory 116 can be a two-dimensional (2D) memory or a three-dimensional (3D) memory.

Figure 1C:
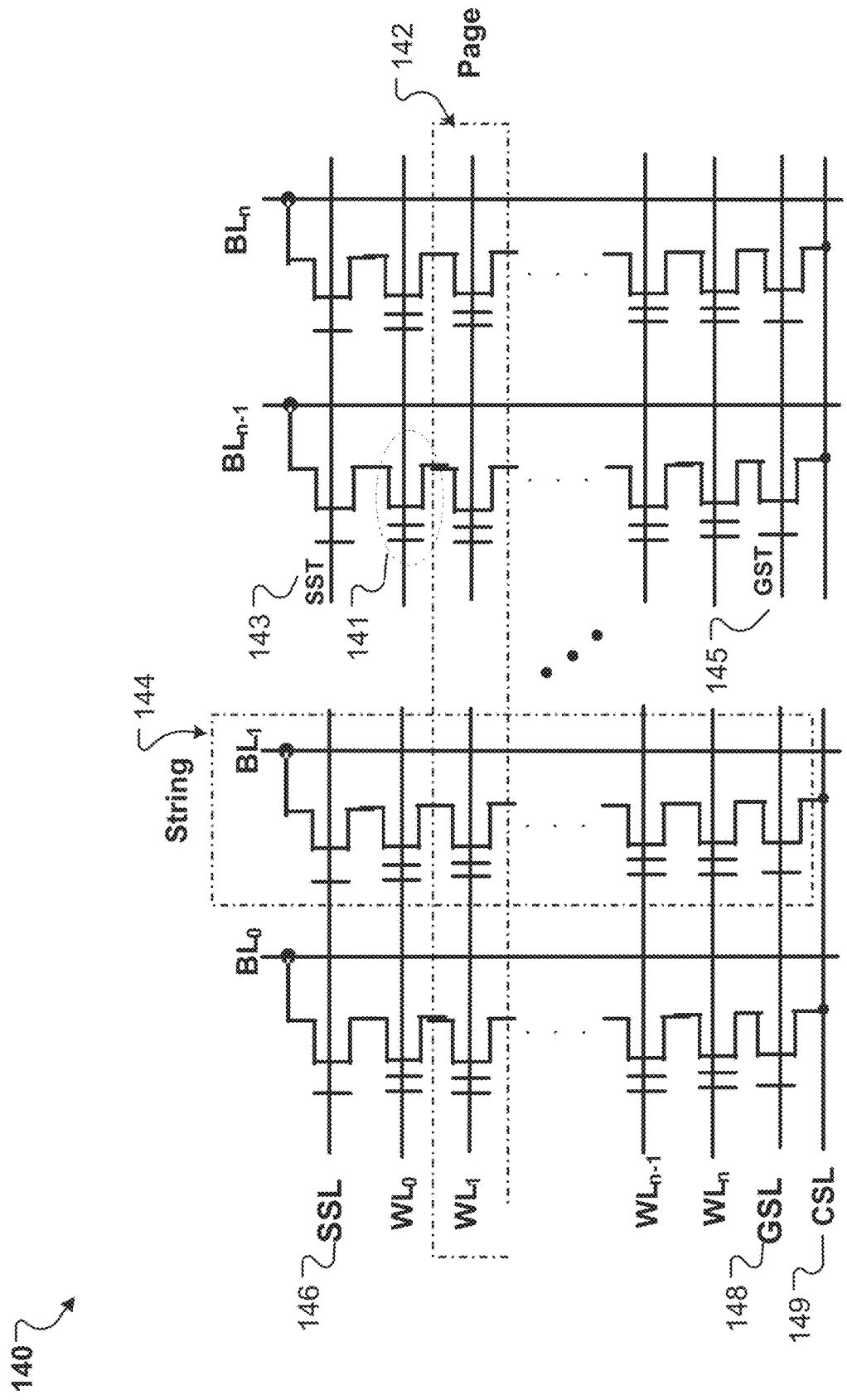
FIG. 1C illustrates an example block of a 2D memory, according to one or more implementations.

FIG. 1C illustrates an example configuration of a two-dimensional (2D) memory block 140 when the memory 116 is a 2D memory. The block 140 can be the block 118. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

A cell string 144 can include a number of memory cells 141, a source select transistor (SST) 143, and a ground select transistor (GST) 145, which are all connected in series. A gate of the SST 143 is connected to a source select line (SSL) 146. Gates of the SSTs in different strings are also connected to the same SSL. Gates of the memory cells 141 are respectively connected to word lines $WL_0$, $WL_1$, ..., $WL_{n-1}$, $WL_n$. The memory cells 141 are connected to a common source line (CSL) 149 via the GST 145. A gate of the GST 145 is connected to a ground select line (GSL) 148. Gates of the GSTs in different strings are also connected to the same GSL. A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142.

To read a particular cell page 142 in the block 140 in a read operation, a lower voltage is applied onto a word line corresponding to the particular cell page 142. Meanwhile, a higher voltage is applied onto the other cell pages in the block 140. When the particular cell page 142 is read a large number of times, e.g., more than 100 million times, the higher voltages can be repeatedly applied onto the other cell pages with the same large number of times, which may cause read disturbance on the other cell pages. Among the other cell pages, a particular cell page may suffer from severe read disturbance. The particular cell page can be considered as a weak page.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

The logical block can have a logical block address (LBA). Each logical page in the logical block can have a logical page address (LPA). The logical page address (LPA) can include the logical block address (LBA) of the logical block and a page number or page offset within the logical block. The physical block can have a physical block address (PBA). Each physical page in the physical block can have a physical page address (PPA). The physical page address (PPA) can include the physical block address (PBA) of the physical block and a page number or page offset within the physical block.

With such a management method, a physical page address (PPA) can be acquired from an address table, e.g., the L2P address mapping table, with an index of a logical page address (LPA). The physical page address (PPA) is an address in the memory 116 for the corresponding logical page (LPA). For example, when the device 110 receives a read command from the host device 120, the device 110 can identify one or more logical page addresses (LPAs) associated with the read command and determine corresponding physical page addresses (PPAs) using the L2P address mapping table.

Figure 1D:
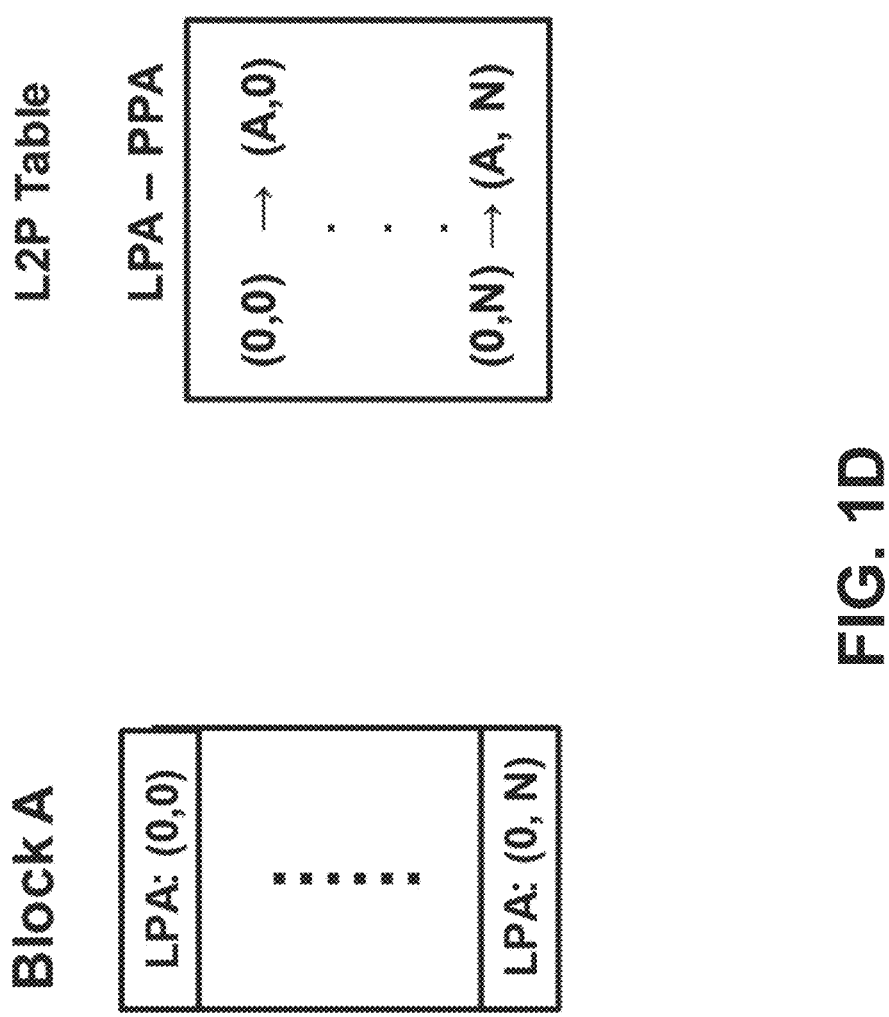
FIG. 1D illustrates an example logical to physical (L2P) mapping table, according to one or more implementations.

FIG. 1D shows an example L2P address mapping table. Logical block 0 includes N logical pages. Each logical page has a respective logical page address (LPA) from (0, 0) to (0, N). Data corresponding to the logical block 0 is stored in physical block A including N physical pages. The L2P address mapping table stores mapping from the N logical pages in logical block 0 to the N physical pages in physical block A. For example, LPA (0,0), ..., LPA (0, N) are sequentially mapped to PPA (A, 0), ..., PPA (A, N).

Figure 1E:
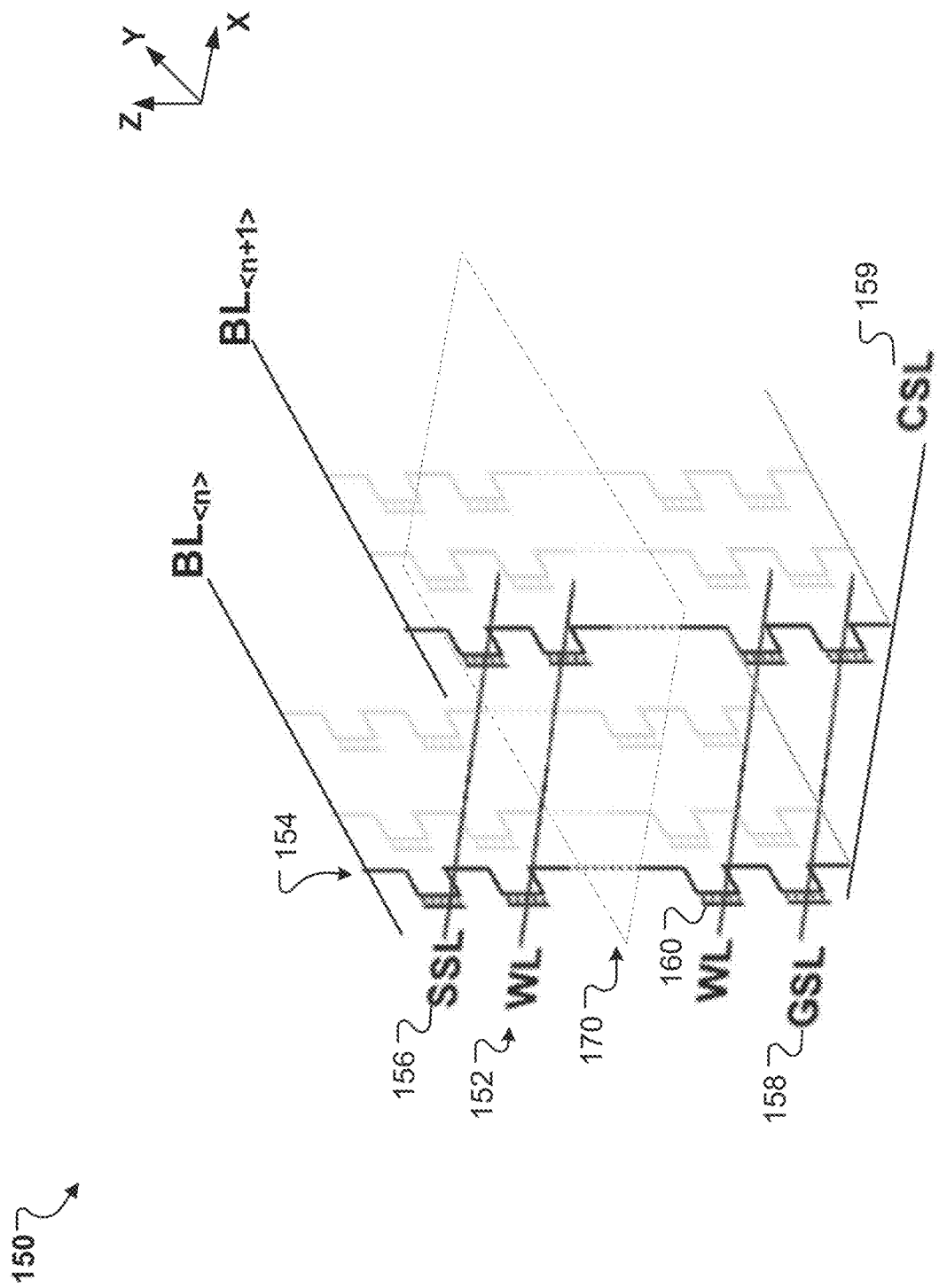
FIG. 1E illustrates an example block of a 3D memory, according to one or more implementations.

FIG. 1E illustrates an example 3D memory block 150 when the memory 116 is a 3D memory. The memory block 150 can be the block 118. Memory cells 160 are arranged in three dimensions, e.g., in an XYZ coordinate system, and coupled to a number of word lines to form a number of cell pages 152 and a number of bit lines to form a number of cell strings 154. A cell string 154 includes a number of memory cells 160 connected in series, where a memory cell 160 can be configured as an SST coupled to a source select line (SSL) 156 and a memory cell 160 can be configured as a GST coupled to a ground select line (GSL) 158. The memory cells 160 are connected to a common source line (CSL) 159 via the GSTs.

The memory block 150 can include a number of memory layers 170 stacked together, e.g., vertically along a Z direction. Each memory layer 170 can be a two-dimensional planar layer, e.g., in an X-Y plane, containing a number of cell pages 152.

To read a particular cell page 152 in a memory layer 170 in a read operation, a lower voltage is applied onto a word line corresponding to the particular cell page 152. The lower voltage is also applied onto other cell pages 152 in the memory layers 170. Meanwhile, a higher voltage is applied onto the other memory layers in the block 150. When the particular cell page 152 is read a large number of times, e.g., more than 100 million times, the higher voltages will be applied onto the other memory layers with the same large number of times, which may cause read disturbance. Among the other memory layers, a particular memory layer may suffer from severe read disturbance. The particular memory layer can be considered as a weak layer.

Figure 2:
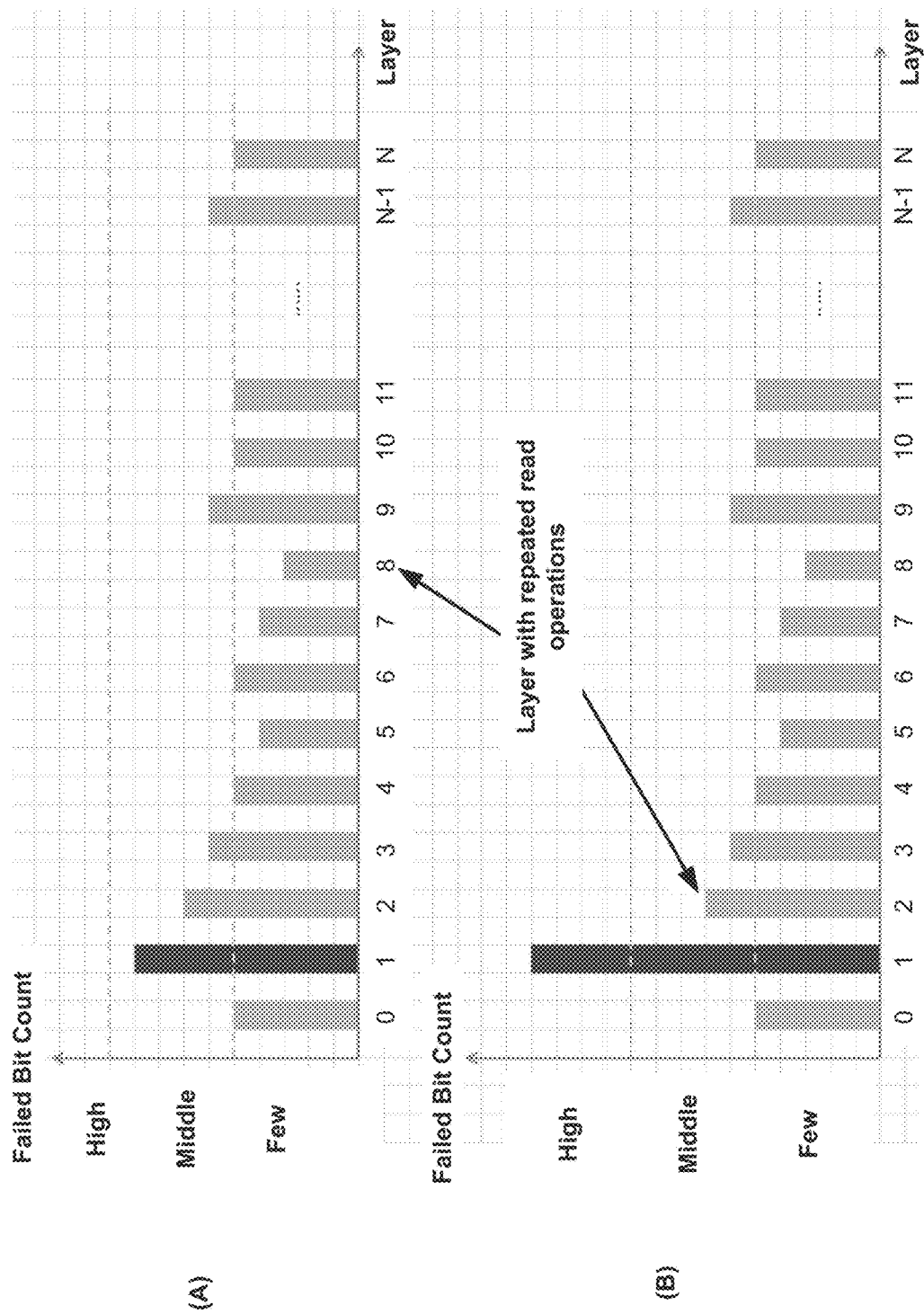
FIG. 2 shows examples of read disturbance effects on memory layers due to repeated read operations.

FIG. 2 shows examples of read disturbance effects on memory layers due to repeated read operations. The memory layers can be the memory layers 170 of FIG. 1D in a block, e.g., the block 150 of FIG. 1D, of a 3D memory, e.g., the memory 116 of FIG. 1A. The block includes N memory layers.

As diagram A in FIG. 2 shows, when repeated read operations are performed on layer 8 (or a page in layer 8), e.g., more than 100 million times, other layers in the block experience different degrees of read disturbance and have different levels of failed bit counts ranging from "few" to "middle". Among the other layers, layer 1 has the highest failed bit count, e.g., in a middle level. Layer 1 can be considered as a weak layer.

As diagram B in FIG. 2 shows, when repeated read operations are performed on layer 2, e.g., more than 100 million times, the other layers in the block also experience different degrees of read disturbance and have different levels of failed bit counts ranging from "few" to "high". Particularly, layer 1 still has the highest failed bit count, e.g., in a high level. Layer 1 has a higher failed bit count when layer 2 is read than when layer 8 is read, which may be due to layer 2 being adjacent to the weak layer 1.

In some cases, ECC can correct failed bits (or error bits) in a memory page or layer. When a count of the failed bits (or a failed bit count) in the memory page or layer is beyond a threshold associated with the ECC, the memory page or layer is considered as a failed page or layer. A refresh operation can then be performed on the block including the failed page or layer. For example, a weak layer, e.g., layer 1 in FIG. 2, can have a higher probability to become a failed layer to cause refresh operation on a block than other layers in the same block.

Implementations of the present disclosure provide methods of rearranging data for refresh operations to reduce read disturbance effects on weak layers or pages so as to reduce refresh operations on blocks including the weak layers or pages. For illustration purposes only, the following description will use 2D memory systems including memory pages as examples. Similar methods can be also applied to 3D memory systems including memory layers.

Figure 3A:
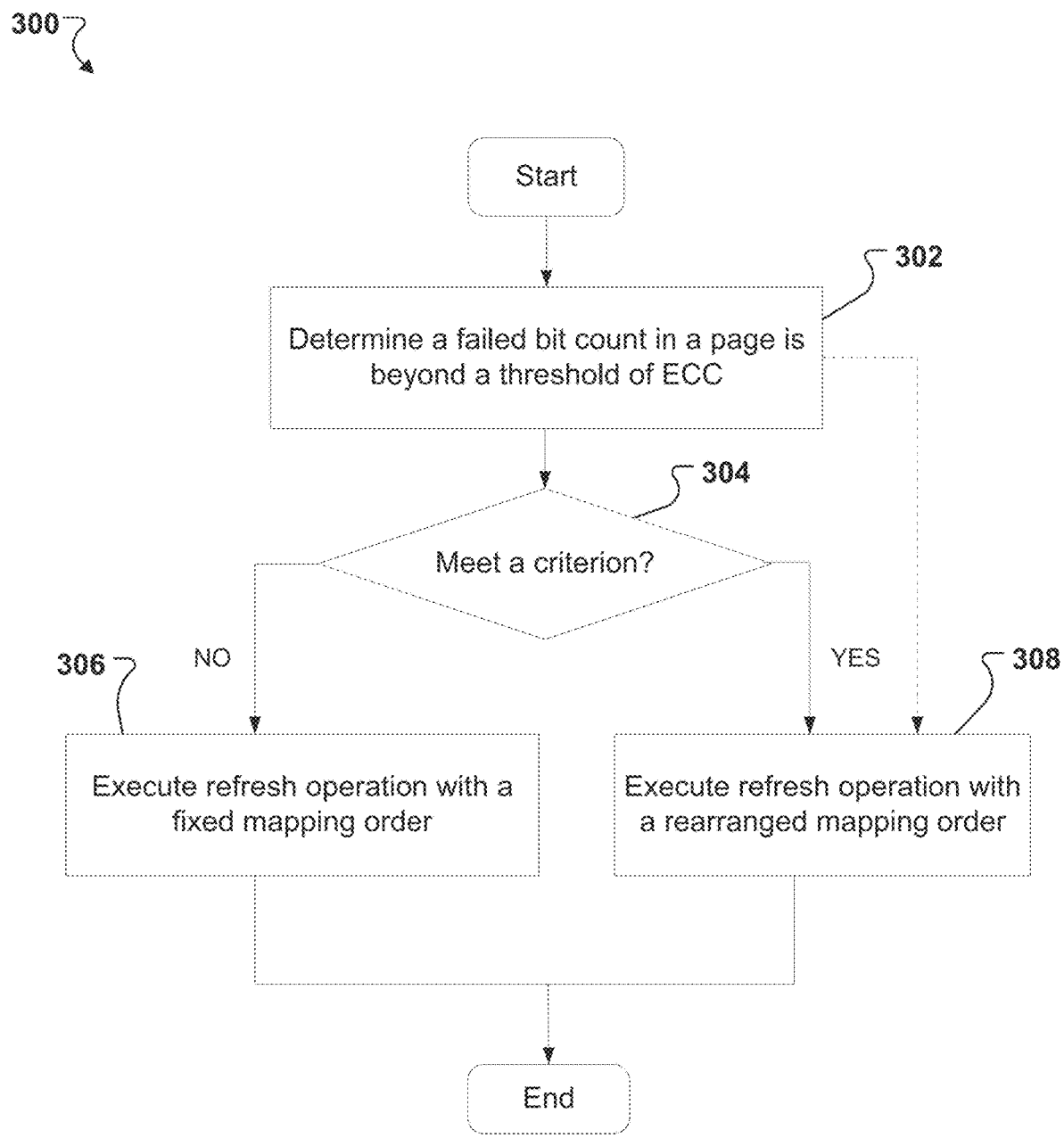
FIG. 3A illustrates an example of a process of rearranging data in a memory, according to one or more implementations.

FIG. 3A illustrates an example of a process 300 to rearrange data in a memory, according to one or more implementations. The process 300 can be performed by a memory controller, e.g., the device controller 112 of FIG. 1A. The memory can be the memory 116 of FIG. 1A.

The memory controller can detect (and/or monitor) failed bit counts for physical pages in a physical block. The physical block can correspond to a logical block and each physical page corresponds to a respective logical page in the logical block. Each logical page has a logical page address (LPA). A failed bit count of a physical page can be also considered as a failed bit count of a logical page or LPA corresponding to (or mapped to) the physical page.

Figure 6:
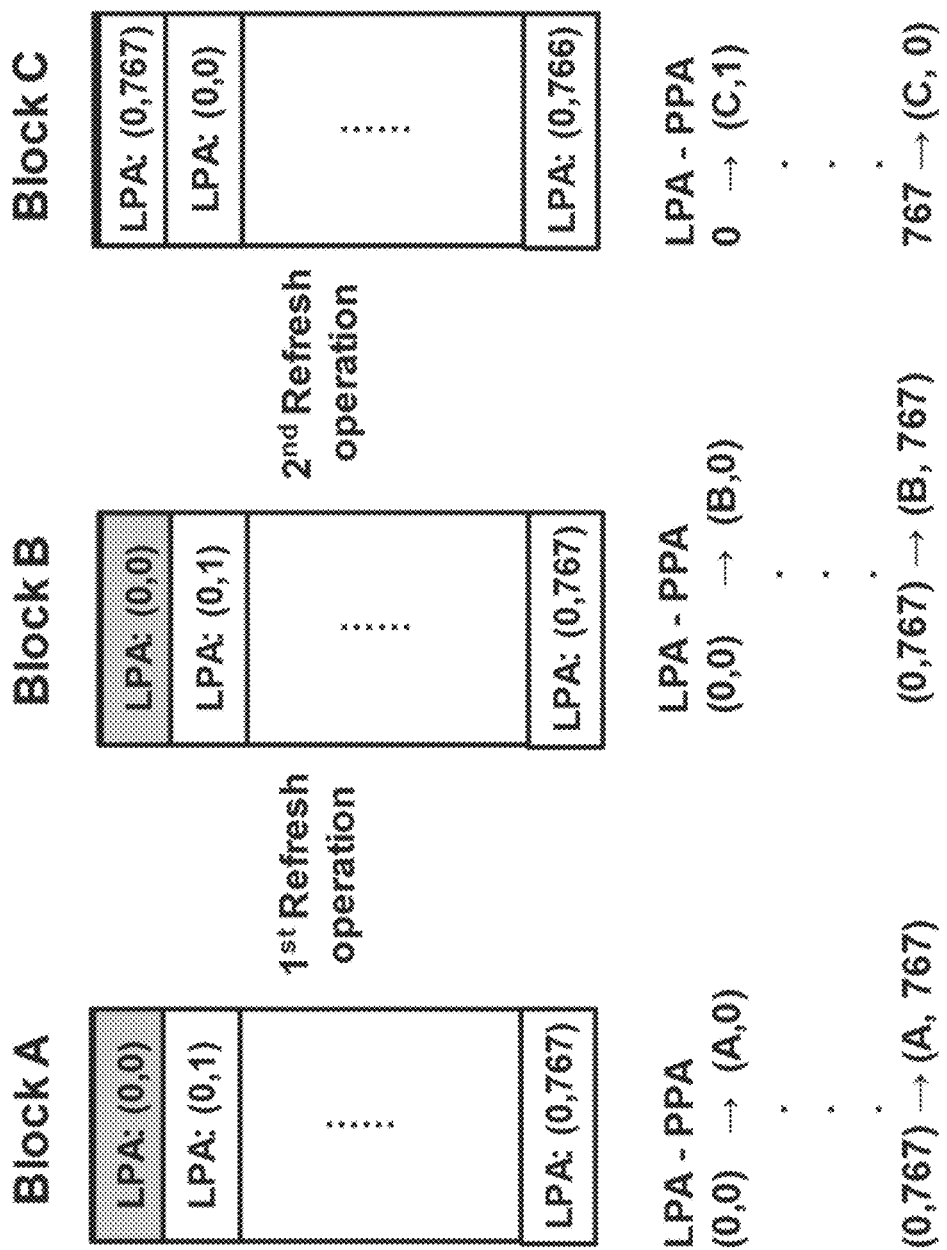
FIG. 6 illustrates an example of rearranging data using a criterion based on a comparison of an LPA of a new failed logical page and a stored LPA of a failed logical page, according to one or more implementations.

The memory controller determines that a failed bit count (or an error bit count) in a particular page is beyond a threshold associated with ECC (302). The ECC can be configured to correct a maximum number of error bits, e.g., 126 bits. The threshold can be set to be 50%, 60%, 70%, 80%, or 90% of the maximum number. When the failed bit count in the particular page is determined to be beyond the threshold of ECC, the particular page can be considered (marked or labelled) as a failed page, and the corresponding logical page can be considered as a failed LPA, e.g., LPA (0,0) in block A as illustrated in FIG. 6. The memory controller can determine to perform a refresh operation on the physical block.

During the refresh operation, data in the physical block can be migrated to a new, empty physical block, and data in each physical page in the physical block can be migrated to a new physical page in the new physical block. The LPAs mapped to the physical pages in the physical block can be remapped to the new physical pages in the new physical block.

Figure 4:
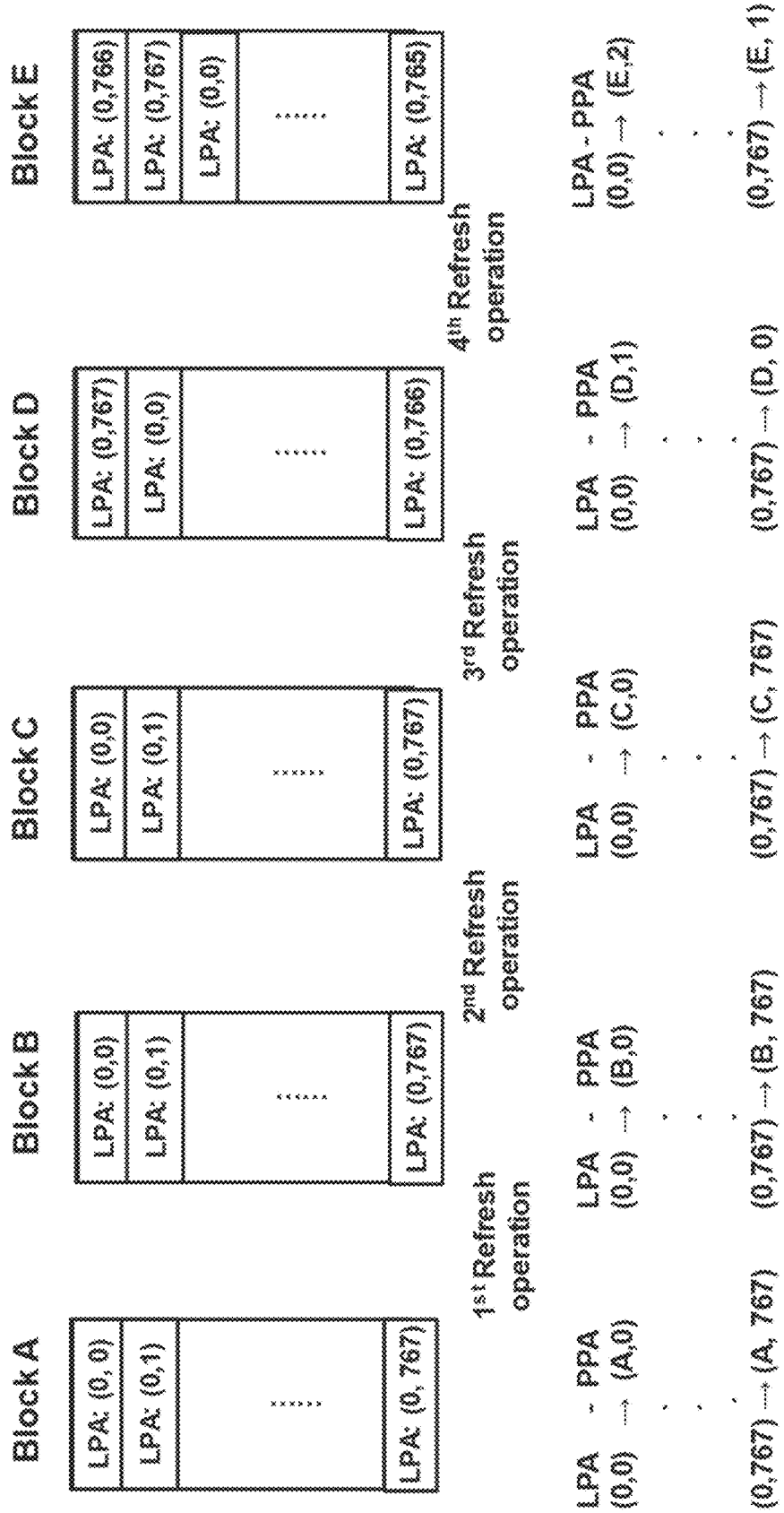
FIG. 4 illustrates an example of rearranging data using a criterion based on a refresh count of a logical block, according to one or more implementations.

In some cases, an order of the LPAs remapped in the new physical block can be the same as an order of the LPAs mapped in the physical block. That is, the mapping order of the LPAs for the refresh operation is fixed. The order of the LPAs in the physical block can be a sequential order. For example, as illustrated in FIG. 4, logic block 0 includes 768 logical pages with respective LPAs from (0, 0) to (0, 767). Logic block 0 is originally mapped to physical block A, with a mapping order from LPA (0, 0) to PPA (A, 0), LPA (0, 1) to PPA (A, 1), . . . , and LPA (0, 767) to PPA (A, 767). That is, logical pages 0 to 767 in logic block 0 is mapped in a sequential order to physical pages 0 to 767 in physical block A.

In a first refresh operation for logic block 0, data in physical block A is migrated to physical block B, and logic block 0 is remapped to physical block B with a remapping order from LPA (0, 0) to PPA (B, 0), LPA (0, 1) to PPA (B, 1), . . . and LPA (0, 767) to PPA(B, 767). That is, respective logical pages 0 to 767 in logical block 0 are mapped in a sequential order to physical pages 0 to 767, respectively, in physical block B. The mapping order of the LPAs in physical block B is the same as the mapping order of the LPAs in physical block A. Thus, the mapping order of the LPAs in the first refresh operation is fixed.

Similarly, in a second refresh operation for logic block 0, data in physical block B is migrated to physical block C, and logic block 0 is remapped to physical block C. The remapping order of the LPAs in physical block C is the same as the mapping order of the LPAs in physical block B. And the mapping order of the LPAs in the second refresh operation is the same as the mapping order of the LPAs in the first refresh operation.

In some cases, an order of the LPAs remapped in the new physical block can be rearranged to be different from an order of the LPAs mapped in the physical block. That is, the mapping order of the LPAs for the refresh operation is varying, or the mapping order of the LPAs for sequential refresh operations are varying. The order of the LPAs in the new physical block can be an offset order. For example, as illustrated in FIG. 4, in a third refresh operation for logic block 0, data in physical block C is migrated to physical block D, and logic block 0 is remapped to physical block D with a remapping order from LPA (0, 0) to PPA (D,1), LPA (0, 1) to PPA (D, 2), . . . and LPA (0, 767) to PPA(D, 0). That is, respective logical pages 0, 1, . . . to 767 in logical block 0 are mapped to respective physical pages 1, 2, . . . , to 0 in physical block D. The mapping order of the LPAs in physical block D is different from the mapping order of the LPAs in physical block C. Thus, the mapping order of the LPAs for the third refresh operation is different from the mapping order of the LPAs for the second refresh operation.

Similarly, in a fourth refresh operation for logic block 0, data in physical block D is migrated to physical block E, and logic block 0 is remapped to physical block E with a remapping order from LPA (0, 0) to PPA (E,2), LPA (0, 1) to PPA (E, 3), . . . and LPA (0, 767) to PPA(E,1). That is, respective logical pages 0, 1, . . . to 767 in logical block 0 are mapped to respective physical pages 2, 3, . . . , to 1 in physical block E. The mapping order of the LPAs in physical block E is different from the mapping order of the LPAs in physical block D. Thus, the mapping order of the LPAs for the fourth refresh operation is different from the mapping order of the LPAs for the third refresh operation. The mapping order of the LPAs for the fourth refresh operation can be also different from the mapping order of the LPAs for the second refresh operation, as illustrated in FIG. 4.

In some cases, for different refresh operations, the mapping orders in the original physical block and the new physical block can be offset with a same offset number. For example, as illustrated in FIG. 4, for the third refresh operation, the mapping order of the LPAs in Block D is offset by 1 from the mapping order of the LPAs in Block C; for the fourth refresh operation, the mapping order of the LPAs in Block E is also offset by 1 from the mapping order of the LPAs in Block D. In some cases, for different refresh operations, the mapping orders can be offset with different offset numbers. That is, the offset number can be variable. For example, a first offset number can be 1, and a second offset number can be 2. In some cases, a sequential offset number can be smaller than a previous offset number. In some cases, a sequential offset number can be larger than the previous offset number.

Referring back to FIG. 3A, the memory controller determines whether a criterion is met (304). The criterion can be based on one or more refresh operations caused by failed logical pages in the memory. If the memory controller determines that the criterion is not met, the memory controller determines to execute a refresh operation with a fixed mapping order on the physical block (306). That is, the mapping order of the LPAs in a new physical block is the same as the mapping order of the LPAs in the physical block.

If the memory controller determines that the criterion is met, the memory controller determines to execute a refresh operation with a rearranged mapping order on the physical block (308). The mapping order of the LPAs in a new physical block is rearranged to be different from the mapping order of the LPAs in the physical block. In such a way, when the logical block is remapped back to the same physical block after a number of refresh operations, the mapping order of the LPAs in the same physical block can be different. Thus, a weak page can be rearranged to a different physical page in the same physical block, which can reduce read disturbance on the physical block.

In some implementations, the rearranged mapping order can be offset from a previous mapping order with an offset number. The offset number can be considered as a rearranging offset or a physical location shift number. The offset number can be 1, 2, 3, or any other value smaller than the number of pages in the physical block. For example, as illustrated in FIG. 4, the offset number for the third refresh operation is 1. LPA (0,0) is remapped from (C, 0) in block C to (D, 1) in block D and LPA (0, 1) is remapped from (C, 1) in block C to (D,2) in block D. A physical position of each LPA in physical block D is offset by 1 compared to a physical position of the LPA in physical block C. Accordingly, LPA (0,767) is remapped from (C, 767) in block C to (D,0) in block D.

In some implementations, the rearranged mapping order can be a scrambling order or a random order. The mapping orders of LPAs to a physical block can be a sequential order or can be a discontinuous order. In some cases, in the rearranged mapping order, a failed LPA, e.g., LPA (0,0), is exchanged with another LPA, and the other LPAs remain unchanged. In some cases, the rearranged mapping order can be based on a statistical analysis, e.g., based on failed bit counts of physical pages in a new physical block the LPAs to be mapped to.

In some implementations, as illustrated in FIG. 3A, the process 300 proceeds from step 302 directly to step 308 without step 304. That is, in response to determining that the memory controller determines that a failed bit count (or an error bit count) in a particular page is beyond a threshold associated with ECC (302), the memory controller can determine to execute a refresh operation with a rearranged mapping order on the physical block (308), without performing determining whether a criterion is met (304).

Figures 3B, 3C:
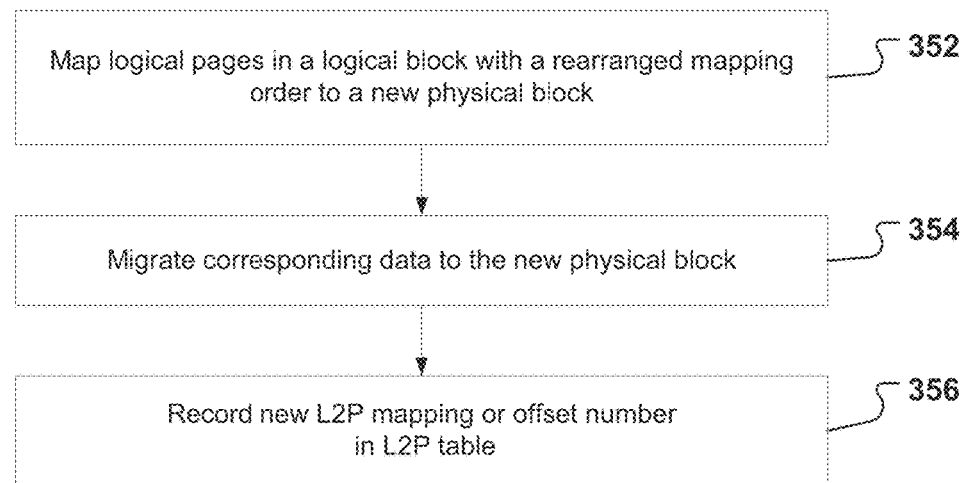
FIG. 3B illustrates examples of criteria for refresh operations, according to one or more implementations.
FIG. 3C illustrates an example of a process of rearranging data for refresh operations, according to one or more implementations.

FIG. 3B illustrates examples of criteria for refresh operations, according to one or more implementations. FIGS. 4-7 illustrate examples of refresh operations according to respective criteria shown in FIG. 3B. For illustration purposes only, a rearranged mapping order is offset from a previous mapping order by an offset number of 1. However, other rearranged mapping orders can be also implemented herein. For illustration purposes only, one criterion is used to determine which mapping order to be adopted for a refresh operation. However, it is also possible to use two or more criteria for the determination, e.g., if any of the two or more criteria are satisfied, then the refresh operation is performed.

In a first example, the criterion is that a refresh count of a logical block is no less than a refresh count threshold. The refresh count is a number of times of refresh operations performed for the logical block. The memory controller can monitor refresh operations in the memory and store individual refresh counts for logical blocks in the memory. When the memory controller determines that the refresh count of the logical block is less than the refresh count threshold, the memory controller determines to execute the refresh operation with a fixed mapping order (step 306). When the memory controller determines that the refresh count of the logical block is no less than the refresh count threshold, the memory controller determines to execute the refresh operation with a rearranged mapping order (step 308).

As illustrated in FIG. 4, the memory controller sets the refresh count threshold for a logical block is 2. Logical block 0 is originally mapped to physical block A. Logical block 0 can include one or more weak pages. When a failed bit count of a weak page in logical block 0 is over a threshold, as discussed in step 302 of FIG. 3A, a refresh operation is performed for logical block 0. The refresh operation is performed on a physical block that logical block 0 is currently mapped to.

As illustrated in FIG. 4, logical block 0 experiences a first refresh operation and is remapped from block A to block B. As the refresh count of logical block is 0 less than the refresh count threshold 2, the memory controller determines to execute the first refresh operation with a fixed mapping order. Thus, the mapping order of LPAs to PPAs in block A is the same as the mapping order of LPAs to PPAs in block B. Accordingly, after the first refresh operation, the refresh count of logical block 0 is increased from 0 to 1. In the second refresh operation, logical block 0 is remapped from block B to block C. As the refresh count of logical block 0 is 1 less than the refresh count threshold, the memory controller determines to execute the second refresh operation with a fixed mapping order. Thus, the mapping order of LPAs to PPAs in block C is the same as the mapping order of LPAs to PPAs in block B. Accordingly, after the second refresh operation, the refresh count of logical block 0 is increased to 2.

When logical block 0 is determined to experience a third refresh operation, the memory controller determines that the refresh count 2 is identical to the refresh count threshold 2. In response, the memory controller determines to execute the third refresh operation with a rearranged mapping order. As discussed above, logical block 0 is remapped from block C to block D. The mapping order of LPAs to block D is different from the mapping order of LPAs to block C. The rearranged mapping order of the LPAs to block D can be offset from the mapping order of the LPAs to block C. The offset number can be 1. Similarly, when logical block 0 is determined to experience a fourth refresh operation, the memory controller determines that the refresh count 3 is more than the refresh count threshold 2. In response, the memory controller determines to execute the fourth refresh operation with a rearranged mapping order. As discussed above, logical block 0 is remapped from block D to block E. The mapping order of LPAs to block E is different from the mapping order of LPAs to block D. The rearranged mapping order of the LPAs to block E can be offset from the mapping order of the LPAs to block D. The offset number can be 1.

Referring back to FIG. 3B, in a second example, the criterion is that a refresh count of the memory is no less than a refresh count threshold. The refresh count is a number of times of refresh operations performed on physical blocks in the memory. The physical blocks correspond to one or more logical blocks. The memory controller can monitor refresh operations on all the physical blocks (or refresh operations for all the logical blocks) in the memory and store refresh counts for the memory. When the memory controller determines that the refresh count of the memory is less than the refresh count threshold, the memory controller determines to execute the refresh operation with a fixed mapping order (step 306). When the memory controller determines that the refresh count of the memory is no less than the refresh count threshold, the memory controller determines to execute the refresh operation with a rearranged mapping order (step 308).

Figure 5:
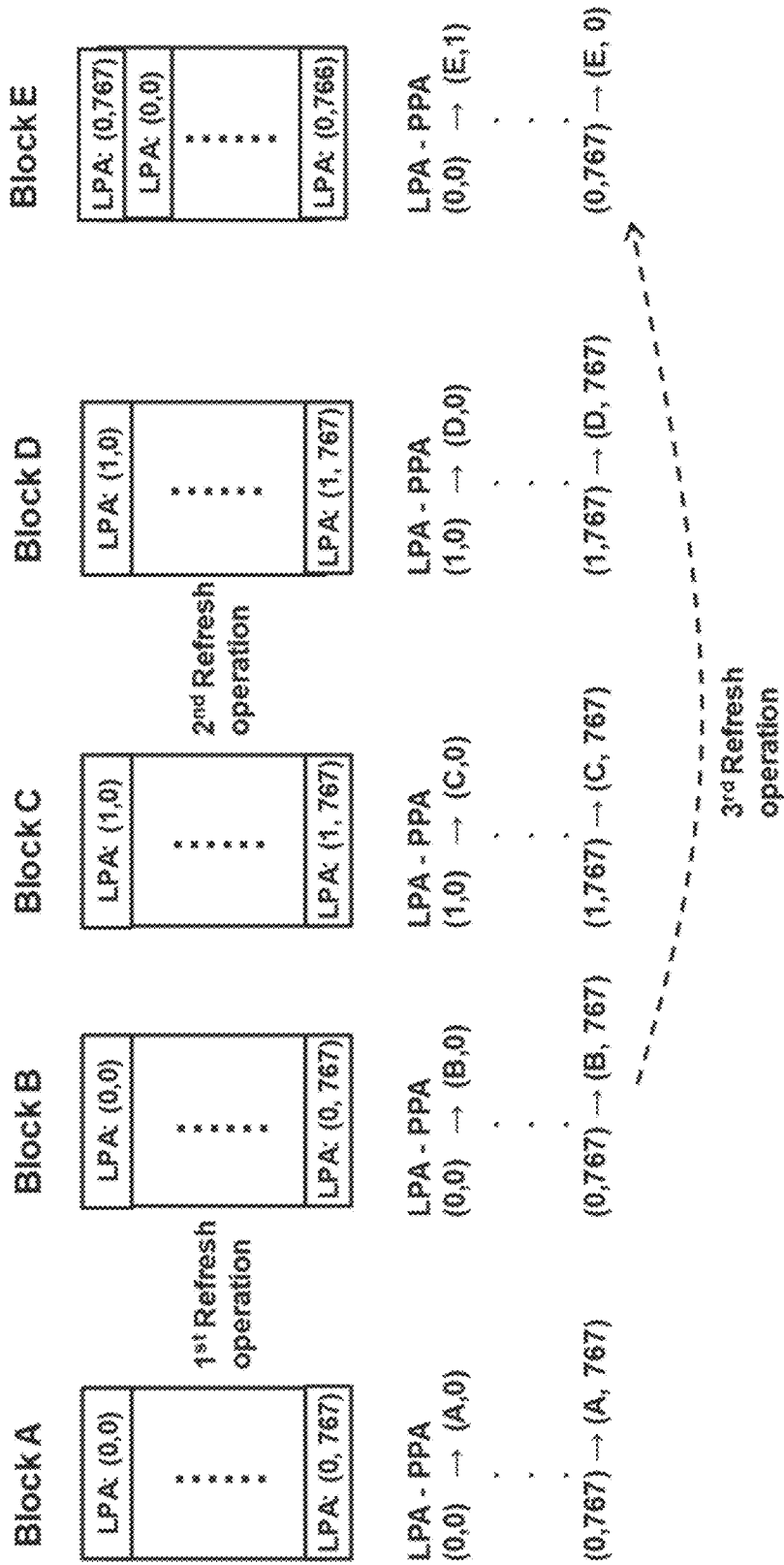
FIG. 5 illustrates an example of rearranging data using a criterion based on a refresh count of a memory, according to one or more implementations.

As illustrated in FIG. 5, the memory controller sets the refresh count threshold for the memory is 2. The memory includes logical block 0 and logical block 1. Logical block 0 is originally mapped to physical block A, and includes 768 logical pages with LPAs from (0,0) to (0, 767) mapped to PPAs from (A,0) to (A,767), respectively. Logical block 1 is originally mapped to physical block C, and includes 768 logical pages with LPAs from (1,0) to (1, 767) mapped to PPAs from (C,0) to (C,767), respectively.

Logical block 0 first experiences a refresh operation and is remapped from block A to block B. As the refresh count of the memory is 0 less than the refresh count threshold 2, the memory controller determines to execute the first refresh operation with a fixed mapping order. Thus, the mapping order of LPAs of logical block 0 to PPAs in block B is the same as the mapping order of LPAs of logical block 0 to PPAs in block A. Accordingly, after the first refresh operation, the refresh count of the memory is increased from 0 to 1.

Logical block 1 experiences a refresh operation and remapped from block C to block D. As the refresh count of the memory is 1 less than the refresh count threshold, the memory controller determines to execute the second refresh operation with a fixed mapping order. Thus, the mapping order of LPAs of logical block 1 to PPAs in block D is the same as the mapping order of LPAs of logical block 1 to PPAs in block C. Accordingly, after the second refresh operation, the refresh count of the memory is increased to 2.

When logical block 0 is determined to experience a third refresh operation in the memory, the memory controller determines that the refresh count 2 is identical to (or no less than) the refresh count threshold 2. In response, the memory controller determines to execute the third refresh operation with a rearranged mapping order. Logical block 0 is remapped from block B to block E. The mapping order of LPAs of logical block 0 to block E is different from the mapping order of LPAs of logical block 0 to block E. The rearranged mapping order of the LPAs to block E can be offset from the mapping order of the LPAs to block B. The offset number can be 1.

Referring back to FIG. 3B, in a third example, the criterion is that a new failed LPA is the same as a stored failed LPA (or a stored refresh LPA). That is, the criterion is that an LPA of a new failed logical page is the same as a stored LPA of a failed logical page. As noted above, in a logical block, there can be a weak page that has a higher probability to fail than other pages. The memory controller can monitor failed bit counts for individual logical pages in the logical block. When the weak page fails, e.g., when a failed bit count of the weak page is more than a threshold associated with ECC, the memory controller records the failed page as a failed LPA (or a refresh LPA) that causes a refresh operation on the logical block. When a new failed LPA occurs, e.g., by the memory controller determining that the failed bit count of the LPA is more than a threshold, the memory controller compares the new failed LPA and the previously stored failed LPA (or fresh LPA). If the memory controller determines that the new failed LPA is not the same as the previously stored failed LPA, the memory controller determines to execute the refresh operation for the logical block with a fixed mapping order (step 306). When the memory controller determines that the new failed LPA is the same as the previously stored failed LPA, the memory controller determines to execute the refresh operation for the logical block with a rearranged mapping order (step 308).

As illustrated in FIG. 6, logical block 0 is originally mapped to physical block A. Logical block 0 can include a weak page LPA (0,0). When a failed bit count of LPA (0,0) is over a predetermined threshold associated with ECC, LPA (0,0) becomes a failed LPA, which causes a first refresh operation to be performed for logical block 0. As there is no previously stored failed LPA, the memory controller determines to perform the first refresh operation for the logical block with a fixed mapping order. Thus, the mapping order of LPAs to PPAs in block A is the same as the mapping order of LPAs to PPAs in a new block B. Accordingly, after the first refresh operation, the memory controller stores the failed LPA (0,0).

After repeated read operations, when a failed bit count of LPA (0,0) in block B is over the predetermined threshold, LPA (0,0) becomes a new failed LPA, which causes a second refresh operation to be performed for logical block 0. The memory controller determines that the new failed LPA (0,0) is the same as the previously stored failed LPA (or refresh LPA) LPA (0,0). In response, the memory controller determines to execute the second refresh operation with a rearranged mapping order. Logical block 0 is remapped from block B to block C. The mapping order of LPAs of logical block 0 to block C is different from the mapping order of LPAs of logical block 0 to block B. The rearranged mapping order of the LPAs to block C can be offset from the mapping order of the LPAs to block B. The offset number can be 1. Accordingly, after the first refresh operation, the memory controller updates the failed LPA to be still LPA (0,0).

In some implementations, the memory controller can monitor failed LPAs in multiple refresh operations and store an LPA failed most (e.g., with the largest fail number) among the failed LPAs as the previously stored LPA for comparison with a new failed LPA in a next refresh operation. The stored LPA for comparison can be updated based on failed LPAs after each refresh operation.

In some implementations, the memory includes two or more logical blocks. A first weak LPA in a first logical block can cause a first refresh operation. The memory controller stores the first LPA for comparison with anew failed LPA in a next refresh operation. If a second weak LPA in a second logical block causes a second refresh operation, the memory controller determines the failed second LPA is not the same as the previously stored failed first LPA, and determines to execute the second refresh operation for the second logical block with a fixed mapping order. After the second refresh operation, the memory controller stores the second LPA for comparison with a new failed LPA in a next refresh operation. If the first weak LPA in the first logical block causes a third refresh operation, the memory controller determines that the failed first LPA is not the same as the previously stored failed second LPA, and the memory controller can determine to execute the third refresh operation for the first logical block with a fixed mapping order, instead of a rearranged mapping order as illustrated in FIG. 6. Thus, the criterion in the third example (and illustrated in FIG. 6) may be not applied to a memory including multiple logical blocks.

Referring back to FIG. 3B, in a fourth example, the criterion is that a new failed LPA is within a stored list of failed LPAs (or a stored list of refresh LPAs). That is, the criterion is that an LPA of a new failed logical page is within a stored list of LPAs of failed logical pages. The memory controller can monitor each refresh operation and generate a list based on failed LPAs from one or more logical blocks in the refresh operations. When the memory controller determines a new failed LPA, the memory controller determines whether the new failed LPA is within the stored list of failed LPAs. If the memory controller determines that the new failed LPA is not within the stored list of failed LPAs, the memory controller determines to execute a refresh operation for a logical block including the new failed LPA with a fixed mapping order (step 306). When the memory controller determines that the new failed LPA is within the stored list of failed LPAs, the memory controller determines to execute the refresh operation for the logical block including the new failed LPA with a rearranged mapping order (step 308).

In some cases, the memory controller can generate the list by including all the failed LPAs in the refresh operations. In some cases, the memory controller can generate the list based on a failed frequency (or a statistical analysis) to include LPAs each having a number of fail times larger than a threshold (e.g., 2).

In some cases, the memory controller can generate the list based on most recent failed LPAs and keep updating the list. For example, the memory controller stores a list of three most recent failed LPAs (3, 4, 5). If a new failed LPA is 6, then the list is updated to (4, 5, 6). If a new failed LPA is 7, then the list is updated to (5, 6, 7).

In one example, as illustrated in FIG. 6, in a first refresh operation, LPA (0,0) in logical 0 fails, and the memory controller stores LPA (0,0) in a list of failed LPAs. In a second refresh operation, LPA (0,0) fails again, and the memory controller determines that the new failed LPA (0,0) is within the stored list of failed LPAs. In response, the memory controller can perform the second refresh operation with a rearranged mapping order. After the second refresh operation, the memory controller updates the list of failed LPAs to still include LPA (0,0).

Figure 7:
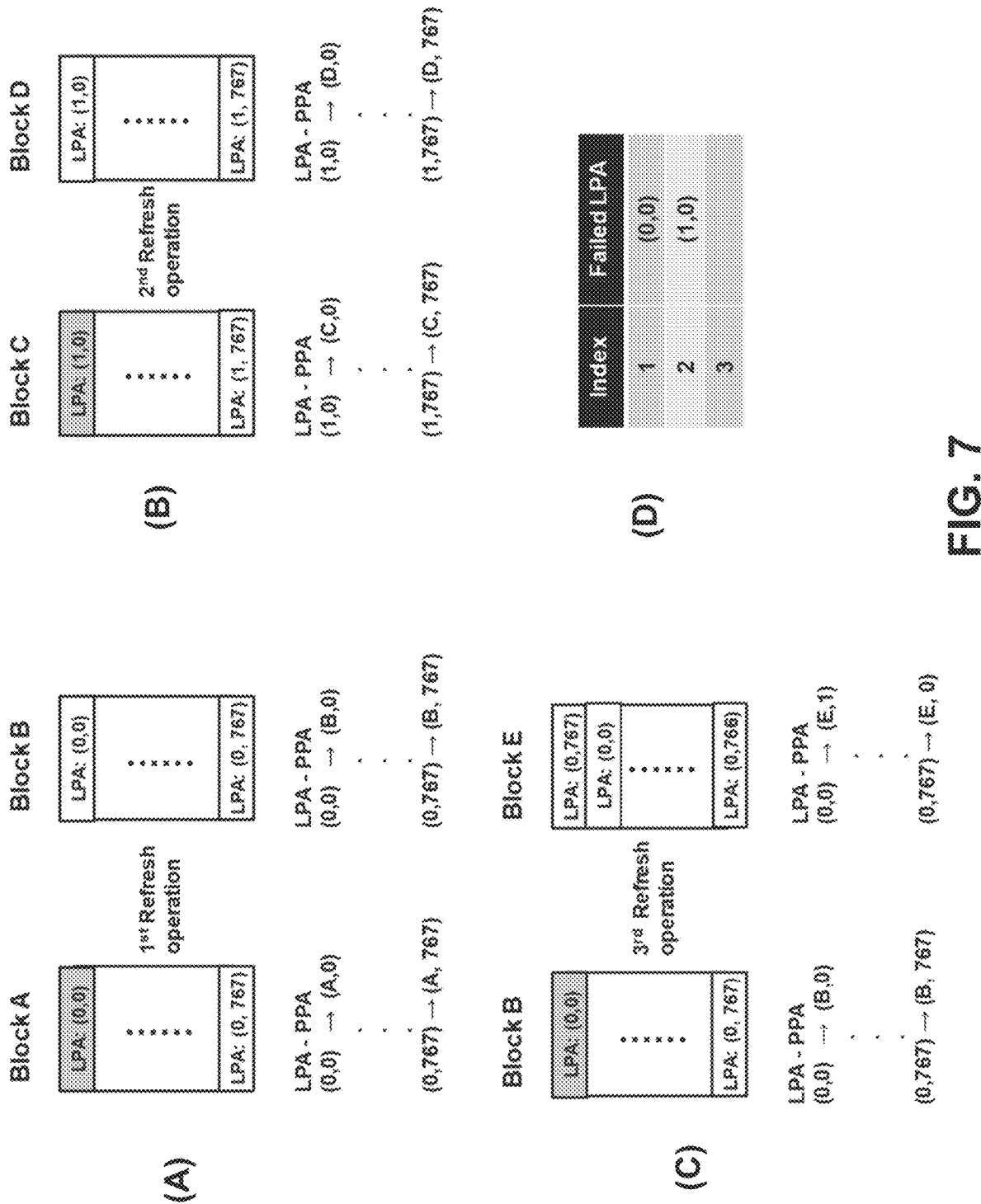
FIG. 7 illustrates an example of rearranging data using a criterion based on a determination of an LPA of a new failed logical page in a stored list of LPAs of failed logical pages, according to one or more implementations.

In another example, as illustrated in FIG. 7, the memory controller includes logical block 0 and logical block 1. Logical block 0 is originally mapped to physical block A, and includes 768 logical pages with LPAs from (0,0) to (0, 767) mapped to PPAs from (A,0) to (A,767), respectively. Logical block 1 is originally mapped to physical block C, and includes 768 logical pages with LPAs from (1,0) to (1, 767) mapped to PPAs from (C,0) to (C,767), respectively.

Initially, the stored list of failed LPAs in the memory controller is empty. First, LPA (0,0) in logical block 0 fails. The memory controller determines that the failed LPA (0,0) is not in the stored list and determines to perform a first refresh operation with a fixed mapping order. Accordingly, as illustrated in diagram (A) of FIG. 7, logical block 0 is remapped from block A to block B, and the mapping order of LPAs of logical block 0 to PPAs in block B is the same as the mapping order of LPAs of logical block 0 to PPAs in block A. After the first refresh operation, the memory controller updates the list of failed LPAs to include LPA (0,0) as the first failed LPA, as illustrated in diagram (D) of FIG. 7.

Second, LPA (1,0) in logical block 1 fails. The memory controller determines that the failed LPA (1,0) is not in the stored list and determines to perform a second refresh operation with a fixed mapping order. Accordingly, as illustrated in diagram (B) of FIG. 7, logical block 1 is remapped from block C to block D, and the mapping order of LPAs of logical block 0 to PPAs in block D is the same as the mapping order of LPAs of logical block 0 to PPAs in block C. After the second refresh operation, the memory controller updates the list of failed LPAs to include LPA (1,0) as the second failed LPA, as illustrated in diagram (D) of FIG. 7.

Third, LPA (0,0) in logical block 0 fails again. The memory controller determines that the failed LPA (0,0) is within the stored list shown in diagram (D), and determines to perform a third refresh operation with a rearranged mapping order. Accordingly, as illustrated in diagram (C) of FIG. 7, logical block 0 is remapped from block B to block E, and the mapping order of LPAs of logical block 0 to PPAs in block E is different from the mapping order of LPAs of logical block 0 to PPAs in block B. The rearranged mapping order of the LPAs to block E can be offset from the mapping order of the LPAs to block B. The offset number can be 1. After the third refresh operation, the memory controller updates the list of failed LPAs to still include LPA (0, 0) and LPA (1,0), as illustrated in diagram (D) of FIG. 7.

Referring to FIG. 3C, an example of a process 350 to rearrange data for refresh operations is shown. The process 350 can be performed by the memory controller of FIG. 3A. The process 350 can be step 308 in FIG. 3A.

Logical pages in a logical block are mapped with a rearranged mapping order to a new physical block (352). As noted above, the rearranged mapping order is different from a current mapping order of the logical pages mapped to a current physical block. The rearranged mapping order can be offset from the current mapping order, e.g., with an offset number (or offset parameter). The rearranged mapping order can be a scrambling order or a random order.

Data corresponding to the logical pages is migrated (or copied) to the new physical block based on the rearranged mapping order (354). The memory controller can read the data from the physical block including the failed physical page, e.g., into a data buffer. The memory controller can also perform error correction processing on the data, e.g., stored in the data buffer, and then write the data subjected to error correction into the new physical block based on the rearranged mapping order. The mapping from the logical pages in the logical block to the physical pages in the new physical block is a new L2P mapping. The new logical to physical (L2P) mapping or offset number is recorded in an L2P table in the memory controller (356). Based on the new L2P mapping or the offset number, the memory controller can determine a physical address (or a physical page) corresponding to a logical addresses (or a logical page).

Although the implementation discussed above has the memory controller to use failed LPA(s) for criteria determination, the memory controller can also use failed PPA(s) for criteria determination. Similarly, the memory controller can also use refresh counts for physical blocks for criteria determination.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of rearranging data in a memory, the method comprising:
    determining that a particular logical page in a logical block fails based on error bits in a particular physical page that is in a first physical block mapped with the logical block and corresponds to the particular logical page, logical pages in the logical block being mapped to physical pages in the first physical block with an initial mapping order; and executing a refresh operation on the first physical block with a rearranged mapping order for the logical block, the rearranged mapping order being different from the initial mapping order, wherein, for the refresh operation, the logical pages in the logical block are mapped to physical pages in a second physical block with the rearranged mapping order.

2. The method of claim 1, wherein determining that the particular logical page fails comprises:
determining a count of the error bits of the particular physical page is beyond a predetermined threshold.

3. The method of claim 2, wherein the predetermined threshold is based on a number of error bits that an error correcting code (ECC) for the particular physical page is capable to correct.

4. The method of claim 1, wherein the rearranged mapping order is offset from the initial mapping order by an offset number, and
wherein physical page addresses (PPAs) in the second physical block that the logical pages are mapped to are offset by the offset number relative to PPAs in the first physical block that the logical pages are mapped to.

5. The method of claim 1, further comprising:
determining that a criterion is met, wherein the criterion is associated with one or more refresh operations caused by failed logical pages in the memory; and
in response to determining that the criterion is met, executing the refresh operation on the first physical block with the rearranged mapping order for the logical block.

6. The method of claim 5, wherein determining that the criterion is met comprises:
determining that a refresh count of the logical block is no less than a refresh count threshold,
wherein the refresh count is configured to be increased when a refresh operation is performed on a physical block mapped with the logical block.

7. The method of claim 5, wherein determining that the criterion is met comprises:
determining that a refresh count of the memory is no less than a refresh count threshold,
wherein the refresh count is configured to be increased when a refresh operation is performed on a physical block in the memory.

8. The method of claim 7, wherein the physical block is mapped with a second logical block different from the logical block.

9. The method of claim 5, wherein determining that the criterion is met comprises:
determining that a logical page address (LPA) of the particular logical page is same as a stored LPA of a specified failed logical page.

10. The method of claim 5, wherein determining that the criterion is met comprises:
determining that a logical page address (LPA) of the particular logical page is within a stored list of LPAs of failed logical pages.

11. The method of claim 10, further comprising:
updating the stored list of LPAs of failed logical pages by including a plurality of LPAs of most recent failed logical pages.

12. The method of claim 1, further comprising:
migrating data in the physical pages of the first physical block to the physical pages of the second physical block based on the rearranged mapping order.

13. The method of claim 1, further comprising:
updating a logical to physical (L2P) mapping table by storing an L2P mapping from the logical block to the second physical block.

14. A memory system comprising:
a memory comprising physical blocks each having a plurality of physical pages; and
a memory controller coupled to the memory and configured to:
determine that a particular logical page in a logical block fails based on error bits in a particular physical page that is in a first physical block mapped with the logical block and corresponds to the particular logical page, logical pages in the logical block being mapped to physical pages in the first physical block with an initial mapping order; and
execute a refresh operation on the first physical block with a rearranged mapping order for the logical block, the rearranged mapping order being different from the initial mapping order, wherein, for the refresh operation, the logical pages in the logical block are mapped to physical pages in a second physical block with the rearranged mapping order.

15. The memory system of claim 14, wherein the memory controller is configured to:
determine whether a criterion is met, wherein the criterion is associated with one or more refresh operations caused by failed logical pages in the memory;
in response to determining that the criterion is met, execute the refresh operation on the first physical block with the rearranged mapping order for the logical block; and
in response to determining that the criterion is not met, execute a second refresh operation on the first physical block with a fixed mapping order for the logical block, the fixed mapping order being same as the initial mapping order, wherein, for the second refresh operation, the logical pages in the logical block are mapped to physical pages in a third physical block with the fixed mapping order.

16. The memory system of claim 15, wherein the criterion comprises one of:
a refresh count of the logical block being no less than a first refresh count threshold, a total refresh count of the physical blocks of the memory being no less than a second refresh count threshold,
a logical page address (LPA) of the particular logical page is same as a stored LPA of a specified failed logical page, and
a physical page address (PPA) of the particular logical page is within a stored list of physical page addresses (PPAs) of failed logical pages.

17. The memory system of claim 14, wherein the memory controller is configured to determine that the particular logical page fails by determining a count of the error bits of the particular physical page is beyond a predetermined threshold, and
wherein the predetermined threshold is based on a number of error bits that an error correcting code (ECC) for the particular physical page is capable to correct.

18. The memory system of claim 14, wherein the memory controller is configured to:
migrate data in the physical pages of the first physical block to the physical pages of the second physical block based on the rearranged mapping order; and update a logical to physical (L2P) mapping table by storing an L2P mapping from the logical block to the second physical block.

19. The memory system of claim 14, wherein the rearranged mapping order is offset from the initial mapping order by an offset number, and
wherein physical page addresses (PPAs) in the second physical block that the logical pages are mapped to are offset by the offset number relative to PPAs in the first physical block that the logical pages are mapped to.

20. A memory controller comprising:
at least one processor; and
at least one non-transitory machine-readable storage medium coupled to the at least one processor having machine-executable instructions stored thereon that, when executed by the at least one processor, cause the at least one processor to perform operations comprising:
determining that a particular logical page in a logical block fails based on error bits in a particular physical page that is in a first physical block mapped with the logical block and corresponds to the particular logical page, logical pages in the logical block being mapped to physical pages in the first physical block with an initial mapping order;
determining whether a criterion is met, the criterion being associated with one or more refresh operations caused by failed logical pages in the memory;
in response to determining that the criterion is not met, executing a first refresh operation on the first physical block with a fixed mapping order for the logical block, the fixed mapping order being same as the initial mapping order, wherein, for the first refresh operation, the logical pages in the logical block are mapped to physical pages in a second physical block with the fixed mapping order; and in response to determining that the criterion is met, executing a second refresh operation on the first physical block with a rearranged mapping order for the logical block, the rearranged mapping order being different from the initial mapping order, wherein, for the second refresh operation, the logical pages in the logical block are mapped to physical pages in a third physical block with the rearranged mapping order.

21. A memory controller comprising:
at least one processor; and
at least one non-transitory machine-readable storage medium coupled to the at least one processor having machine-executable instructions stored thereon that, when executed by the at least one processor, cause the at least one processor to perform operations comprising:
determining that a particular logical page in a logical block fails based on error bits in a particular physical page that is in a first physical block mapped with the logical block and corresponds to the particular logical page; and
executing a refresh operation on the first physical block by rearranging data in the first physical block to a second physical block with at least one programming parameter different from that for the data programmed to the first physical block;
wherein logical pages in the logical block are mapped to physical pages in the first physical block with an initial mapping order, and wherein the logical pages in the logical block are mapped to physical pages in the second physical block with a rearranged mapping order that is different from the initial mapping order.

22. The memory controller of claim 21, wherein the at least one programming parameter comprises programming time, programming voltage, internal time, or a mapping order for the logical block.

* * * * *